(12) United States Patent
Brunolli

(10) Patent No.: US 9,595,944 B2
(45) Date of Patent: Mar. 14, 2017

(54) LOW POWER ARCHITECTURES

(71) Applicant: QUALCOMM Incorporated, San Diego, CA (US)

(72) Inventor: Michael Joseph Brunolli, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/858,966

(22) Filed: Sep. 18, 2015

(65) Prior Publication Data

US 2016/0013775 A1 Jan. 14, 2016

Related U.S. Application Data

(62) Division of application No. 14/213,907, filed on Mar. 14, 2014, now Pat. No. 9,184,733.

(60) Provisional application No. 61/800,116, filed on Mar. 15, 2013.

(51) Int. Cl.
*H03K 3/012* (2006.01)
*H03K 3/356* (2006.01)
*H03K 3/037* (2006.01)

(52) U.S. Cl.
CPC .......... *H03K 3/012* (2013.01); *H03K 3/0375* (2013.01); *H03K 3/356104* (2013.01); *H03K 3/356* (2013.01)

(58) Field of Classification Search
CPC ................. H03K 3/012; H03K 3/0375; H03K 3/356104; H03K 3/356
USPC ....................................................... 327/178
See application file for complete search history.

(56) References Cited

U.S. PATENT DOCUMENTS

| | | | |
|---|---|---|---|
| 5,568,429 A | 10/1996 | D'Souza et al. | |
| 5,646,557 A | 7/1997 | Runyon et al. | |
| 6,252,418 B1 | 6/2001 | Durham et al. | |
| 6,566,927 B2 | 5/2003 | Park et al. | |
| 6,587,907 B1 | 7/2003 | Ashby | |
| 6,594,331 B1 * | 7/2003 | Soda ..................... | H03D 13/004 375/374 |
| 6,944,252 B2 * | 9/2005 | Okamoto ............. | H03D 13/004 375/376 |
| 7,362,156 B2 * | 4/2008 | Muranishi ................ | G06F 1/06 327/237 |
| 7,486,702 B1 | 2/2009 | Yang | |
| 7,554,877 B2 | 6/2009 | Kang et al. | |
| 8,103,898 B2 | 1/2012 | Dimitriu et al. | |

(Continued)

OTHER PUBLICATIONS

Alstad H P., et al., "Seven subthreshold flip-flop cells", NORCHIP, 2007, IEEE, Piscataway, NJ, USA, Nov. 19, 2007 (Nov. 19, 2007), pp. 1-4, XP031240537, ISBN: 978-1-4244-1516-8 p. 2, left-hand column, figure 2.

(Continued)

*Primary Examiner* — Ryan Jager
(74) *Attorney, Agent, or Firm* — Loza & Loza LLP

(57) ABSTRACT

Systems and methods for tuning a voltage are described herein. In one embodiment, a method comprises sending a data signal to first and second flops via a data path, latching in the data signal at the first flop using a clock signal, and latching the data signal at the second flop using a delayed version of the clock signal. The method also comprises detecting a mismatch between outputs of the first and second flops, and adjusting the voltage based on the detected mismatch.

8 Claims, 12 Drawing Sheets

(56) References Cited

U.S. PATENT DOCUMENTS

| | | |
|---|---|---|
| 8,294,492 B2 | 10/2012 | Bol et al. |
| 8,633,753 B2 | 1/2014 | Chae |
| 9,054,689 B2* | 6/2015 | Maruko ............ H03K 3/35625 |
| 2002/0020886 A1 | 2/2002 | Rockett |
| 2002/0051510 A1* | 5/2002 | Noguchi ............ H03D 13/004 |
| | | 375/376 |
| 2004/0062336 A1* | 4/2004 | Kuwata ............... H03L 7/081 |
| | | 375/376 |
| 2006/0158262 A1* | 7/2006 | Robinson ............ H03L 7/087 |
| | | 331/16 |
| 2007/0132495 A1 | 6/2007 | Yang et al. |
| 2008/0030231 A1 | 2/2008 | Hashimoto |
| 2008/0258790 A1 | 10/2008 | Branch et al. |
| 2009/0278520 A1 | 11/2009 | Perreault et al. |
| 2011/0267096 A1* | 11/2011 | Chlipala .......... G01R 31/31858 |
| | | 326/16 |
| 2014/0266369 A1 | 9/2014 | Brunolli |

OTHER PUBLICATIONS

Chang I K., et al., "Robust Level Converter for Sub-Threshold/Super-Threshold Operation:100 mV to 2.5 V", IEEE Transactions on Very Large Scale Integration (VLSI) Systems, IEEE Service Center, Piscataway, NJ, USA, vol. 19, No. 8, Aug. 1, 2011 (Aug. 1, 2011), pp. 1429-1437, XP011336682, ISSN: 1063-8210, DOI: 10.1109/TVLSI.2010.2051240 p. 1430, right-hand column, paragraph 2—p. 1431, right-hand column, paragraph 1, figures 5, 6.
International Search Report and Written Opinion—PCT/US2014/029721—ISA/EPO—Sep. 8, 2014.
Partial International Search Report—PCT/US2014/029721—ISA/EPO—Jun. 27, 2014.

* cited by examiner

US 9,595,944 B2

LOW POWER ARCHITECTURES

RELATED APPLICATION

The present application is a divisional of U.S. application Ser. No. 14/213,907, filed on Mar. 14, 2014, which claims priority under 35 U.S.C. §119(e) to U.S. Provisional Application No. 61/800,116, filed on Mar. 15, 2013, the entire specification of which is incorporated herein by reference.

BACKGROUND

Field

Aspects of the present disclosure relate generally to low power devices, and more particularly to low power devices in which transistors are operated near or in the sub-threshold region to reduce power consumption.

Background

Transistors in a device can be operated near or in the sub-threshold region to substantially reduce power consumption of the device. For instance, sub-threshold operation enables the energy consumption per cycle to be minimized.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to a device for tuning a voltage. The device comprises a data path for propagating a data signal, a first flop configured to receive the data signal from the data path, to receive a clock signal, and to latch the data signal using the clock signal, and a second flop configured to receive the data signal from the data path, to receive a delayed version of the clock signal, and to latch the data signal using the delayed version of the clock signal. The device also comprises a circuit configured to detect a mismatch between outputs of the first and second flops, and a voltage adjuster configured to adjust the voltage based on the detected mismatch.

A second aspect relates to a method for tuning a voltage. The method comprises sending a data signal to first and second flops via a data path, latching in the data signal at the first flop using a clock signal, and latching the data signal at the second flop using a delayed version of the clock signal. The method also comprises detecting a mismatch between outputs of the first and second flops, and adjusting the voltage based on the detected mismatch.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

Figure 1A:
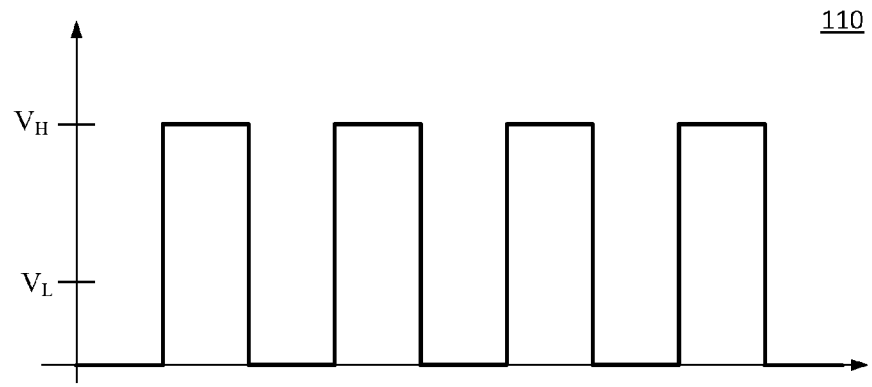
FIG. 1A shows a high-voltage clock signal according to an embodiment of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

In a system, a clock signal may be generated at a clock source and distributed to different devices (e.g., flops) in the system via a clock tree. The clock tree may branch out into a plurality of clock paths for distributing the clock signal to the different devices. The clock tree may include one or more buffers (e.g., inverters) along each clock path.

A data signal may be launched from a data source in the system and propagate down a data path to a device (e.g., flop) in the system. The system may include one or more buffers (e.g., inverters) and/or other types of logic along the data path. For the example of a flop, the flop may receive the data signal from the data path and the clock signal from the clock tree. The flop may use the clock signal to time latching of the data signal at the flop. For example, the flop may latch a logic value of the data signal on each rising or falling edge of the clock signal. In order for the flop to correctly latch a logic value of the data signal, the logic value should be stable (not change) for a period of time after a rising or falling edge of the clock (referred to as the hold time). Failure to meet this timing condition results in a hold violation, which may cause the flop to enter a metastable state. In conventional systems, the propagation delays in the clock tree and the data path are adjusted (e.g., using buffers) to ensure that this timing condition is meet.

However, controlling the timing of the data and clock propagation delays is very difficult for systems in which transistors are purposely operated in the sub-threshold region (i.e., systems in which a maximum gate voltage provided to a transistor with the intent of turning the transistor on is less than the threshold voltage of the transistor). This is because, when a transistor operates in the sub-threshold region, the current of the transistor is exponentially related to gate voltage, making the current of the transistor exponentially sensitive to the threshold voltage (Vt) of the transistor and/or supply voltage. Thus, even small variations in the threshold voltages and/or supply voltages among transistors operating in the sub-threshold region can lead to large variations in their currents. This, in turn, leads to large variations in delays among buffers and/or other logic implemented with the transistors, and hence large variations in propagation delays in the clock tree and data paths. The large variation in propagation delays makes it very difficult to control the timing of the clock signal relative to a data signal at a flop to satisfy the hold condition. For instance, two paths with the same number of buffers can have drastically different delays due to Vt and/or supply voltage variations.

Embodiments of the present disclosure address the above problem using a high-voltage clock signal, while still using a low-voltage data signal to reduce power consumption (e.g., data signal having a high state corresponding to a sub-threshold voltage). In this regard, FIG. 1A shows a voltage-time diagram of a high-voltage clock signal 110 according to one embodiment. The voltage of the high-voltage clock signal 110 may swing between a high voltage ($V_H$) and ground, where $V_H$ may be greater than the threshold voltages of transistors in the clock tree. For example, $V_H$ may be several hundred millivolts above the threshold voltages, and may be the voltage of a battery used to power a portable device in which the high-voltage clock signal 110 is used.

Figure 1B:
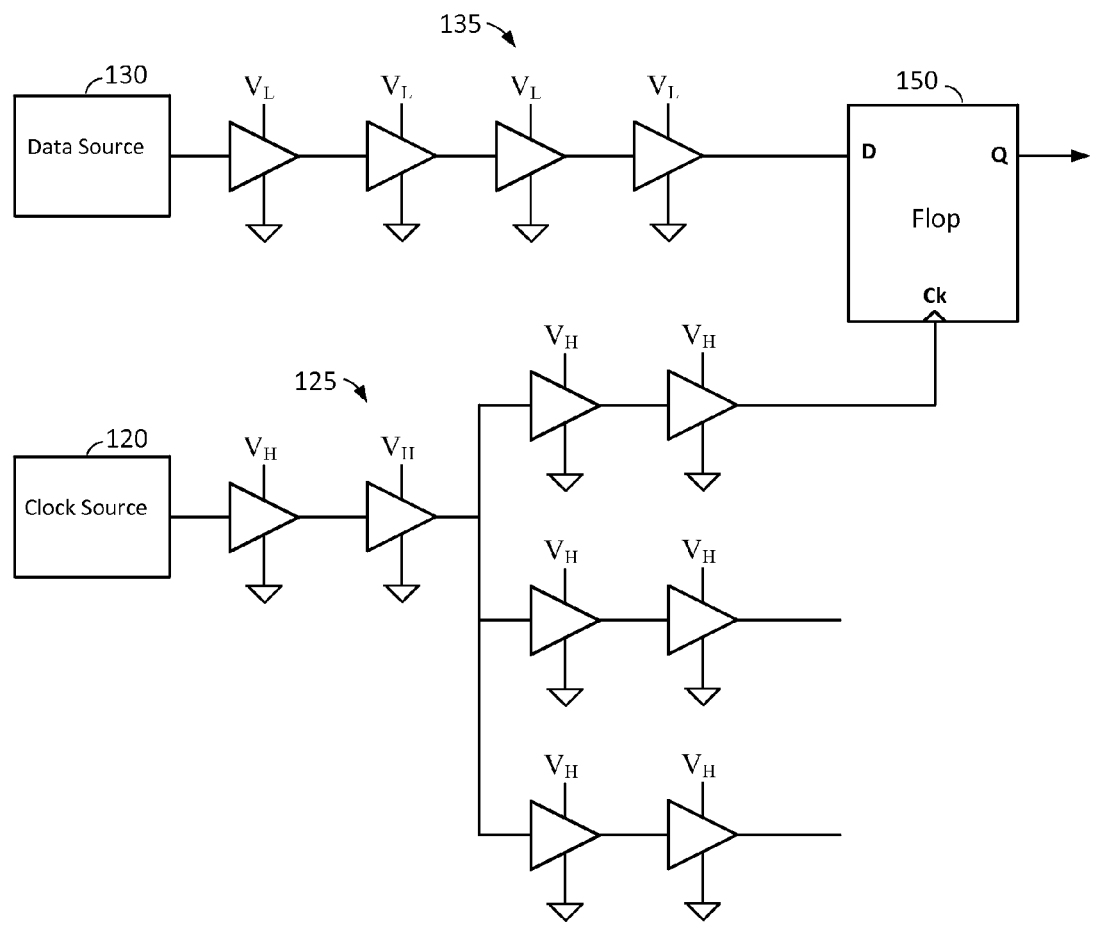
FIG. 1B shows a clock tree according to an embodiment of the present disclosure.

FIG. 1B shows an example of a corresponding clock source 120 and clock tree 125. The clock source 120 generates the high-voltage clock signal 110, which is distributed to devices via the clock tree 125. The clock tree 125 may include buffers that are powered by $V_H$, which may be above the threshold voltages of transistors in the buffers. When $V_H$ is above the threshold voltages of the transistors in the clock tree 125, these transistors operate in the strong-inversion region, and are therefore much faster than transistors operating in the sub-threshold region. As a result, the propagation delay of the high-voltage clock signal 110 is much shorter than the propagation delay of a data signal, as discussed further below.

FIG. 1B also shows an example of a data source 130 and a data path 135. The data source 130 launches a data signal. The voltage of the data signal may have a swing between a low voltage ($V_L$) and ground, where $V_L$ is approximately at or below the threshold voltages of transistors in the data path 135. For example, $V_L$ may be approximately 300 mV. FIG. 1A shows an example of $V_L$ relative to $V_H$. The data path 135 may include a plurality of buffers, computational logic and/or other types of logic devices that are power by $V_L$. This causes the transistors in the data path 135 to operate in the sub-threshold region, and therefore to be much slower than the transistors in the clock tree 125, which may operate in the strong-inversion region. As a result, the propagation delay of the high-voltage clock signal is much shorter than the propagation delay of the data signal.

Because the transistors in the data path 135 operate in the sub-threshold region, the propagation delay of the data signal may vary over a wide range depending on the threshold voltages of the transistors and/or other factors. However, the propagation delay of the high-voltage clock signal is much shorter than even the shortest propagation delay within this range. Thus, when the high-voltage clock signal and the data signal are input to a flop 150 (an example of which is shown in FIG. 1B), the high-voltage clock signal is practically guaranteed to propagate to the flop 150 ahead of the data signal by at least the hold time. Thus, the high-voltage clock signal prevents hold violations.

Figure 2A:
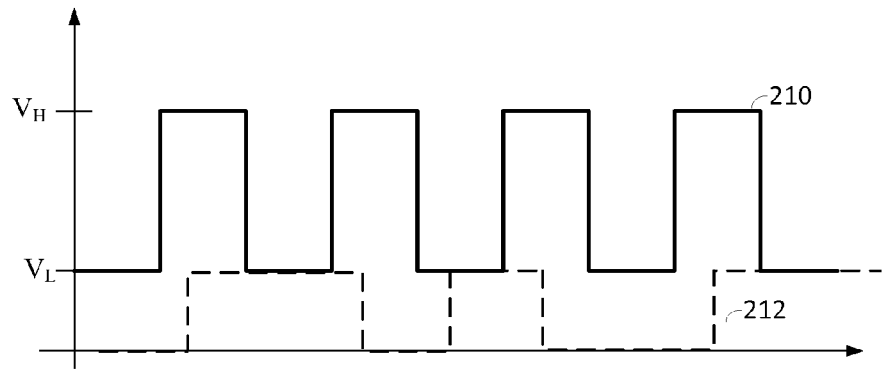
FIG. 2A shows a high-voltage clock signal according to another embodiment of the present disclosure.

FIG. 2A shows a voltage-time diagram of a high-voltage clock signal 210 according to another embodiment. The voltage of the high-voltage clock signal 210 may swing between $V_H$ and $V_L$. As discussed further below, this allows charge from the clock tree to be dumped into a low-power supply used to power logic operating in the sub-threshold region. The voltage difference $V_H-V_L$ may be at or above the threshold voltages of the transistors in the clock tree. FIG. 2A also shows an example of a data signal 212 having a voltage swing between $V_L$ and ground, where between $V_L$ may correspond to a logic one and ground may correspond to a logic zero. It is to be appreciated that the relative positions of the data edges and clock edges shown in FIG. 2A are exemplary only and may vary (e.g., depending on relative propagation delays).

Figure 2B:
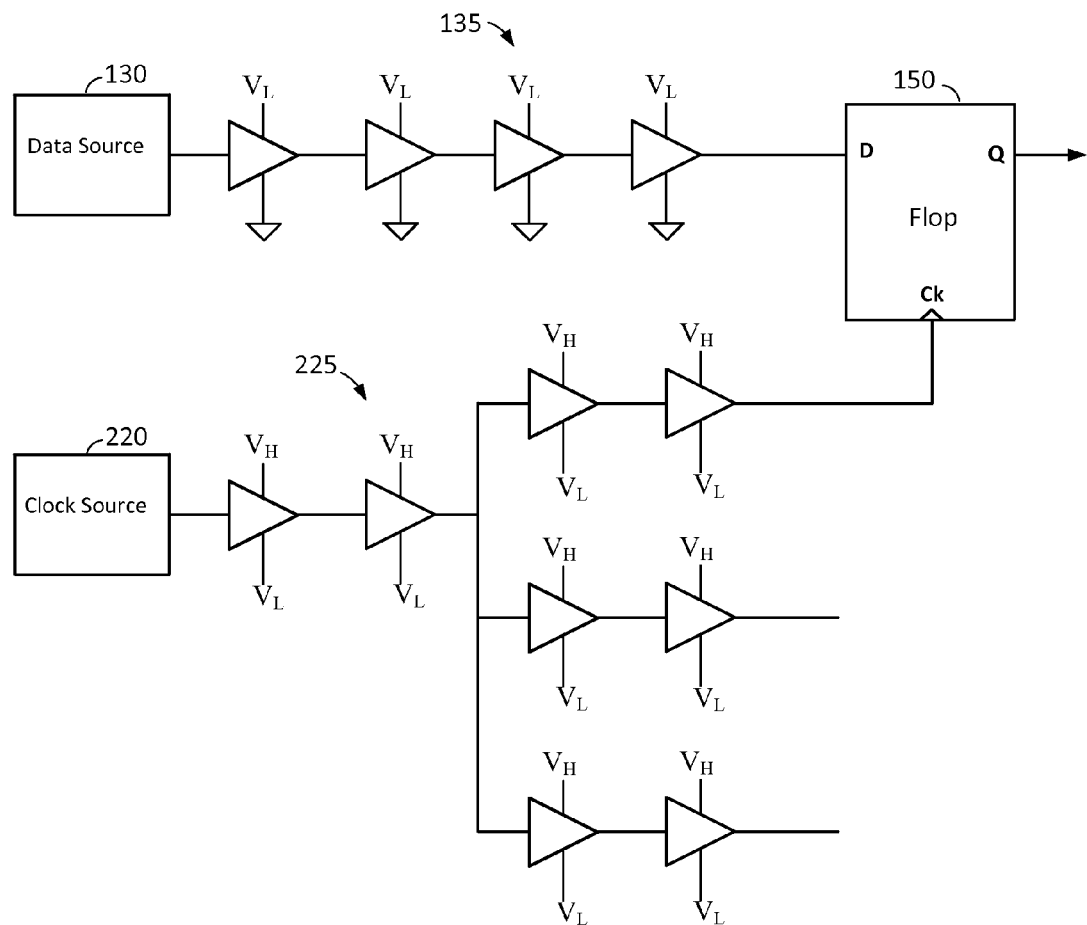
FIG. 2B shows a clock tree according to another embodiment of the present disclosure.

FIG. 2B shows an example of a corresponding clock source 220 and clock tree 225. The clock source 220 generates the high-voltage clock signal 210, which is distributed to devices via the clock tree 225. The clock tree 125 may include buffers that are powered between $V_H$ and $V_L$, as shown in FIG. 2B. Because the voltage difference $V_H-V_L$ is at or above the threshold voltages of the transistors in the clock tree 225, these transistors are much faster than transistors operating in the sub-threshold region. As a result, the propagation delay of the high-voltage clock signal 210 is much shorter than the propagation delay of the data signal in the data path 135, thereby preventing hold violations.

The clock frequency of the high-voltage clock signal 110/210 may also be adjusted to prevent setup violations. A setup violation may occur when the data signal does not propagate to a flop fast enough for the data signal to settle to a stable value at the flop before a clock edge at which the flop clocks in the data signal. When this occurs, the clock frequency may be slowed to provide the data signal more time to settle before the clock edge. The clock edge transitions very quickly compared to the data because the clock edge transition slope is determine by $V_H$ and not $V_L$.

Operating the data and/or logic using $V_L$ substantially reduces power consumption compared to $V_H$. This substantially extends the battery life of very low power devices such as battery-powered medical devices, tracking devices, and "always on" devices that can always be on for an extended period of time (e.g., years) yet be powered by a battery because of the low power consumption of the device.

Figure 3:
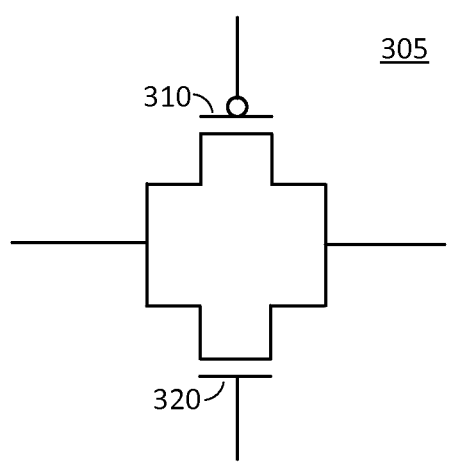
FIG. 3 shows an example of a CMOS transfer gate.

The high-voltage clock signal 110/210 may be used to reduce the gate count (number of transistors) in a flop by replacing at least one CMOS transfer gate in the flop with a single NFET. In this regard, FIG. 3 shows an example of a CMOS transfer gate 305 that is commonly used in flops to transfer a logic value of a data signal within the flop. The CMOS transfer gate comprises a PFET 310 and an NFET 320 coupled in parallel. The gates of the PFET 310 and the NFET 320 are driven by complimentary signals. For example, the gate of the NFET 320 may be driven by a clock signal and the gate of the PFET 310 may be driven by an inverse of the clock signal, or vice versa. The PFET 310 is used to transfer a high logic value while the NFET 320 is used to transfer a low logic value.

Figure 4:
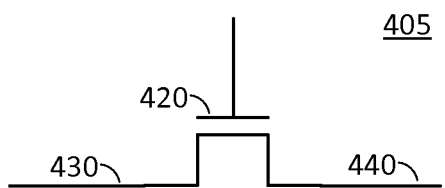
FIG. 4 shows an example of a single-NFET transfer gate.

FIG. 4 shows an example of a transfer gate 405 comprising a single NFET 420 with no PEFT. The single NFET 420 may be not be capable of transferring a high logic value when the high state of the clock signal driving the gate of the NFET 420 corresponds to approximately the same voltage as the high logic value. This is because the voltage at the gate of the NFET 420 is reduced by the gate-to-source voltage of the NFET 420 (e.g., approximately Vt when NFET 420 is turned on) at the output 440 of the transfer gate 420. If the high logic value corresponds to a voltage below Vt, then the voltage at the output 440 may be reduced to zero.

The high-voltage clock signal 110/210 according to embodiments of the present disclosure allows the single NFET 420 to transfer a high logic value. This is because the high state of the high-voltage clock signal 110/210 corresponds to a larger voltage ($V_H$) than the high logic value of the data signal ($V_L$). As a result, even when the voltage ($V_H$) at the gate of the NFET 420 is reduced by the gate-to-source voltage of the NFET 420 at the output 440, the voltage at the output 440 may still be approximately $V_L$. This assumes that the voltage difference $V_H$–$V_L$ is sufficiently large (e.g., at least as large as the threshold voltage Vt of NFET 420) to absorb the gate-to-source voltage of the NFET 420 when the NFET 420 is turned on.

Figure 5:
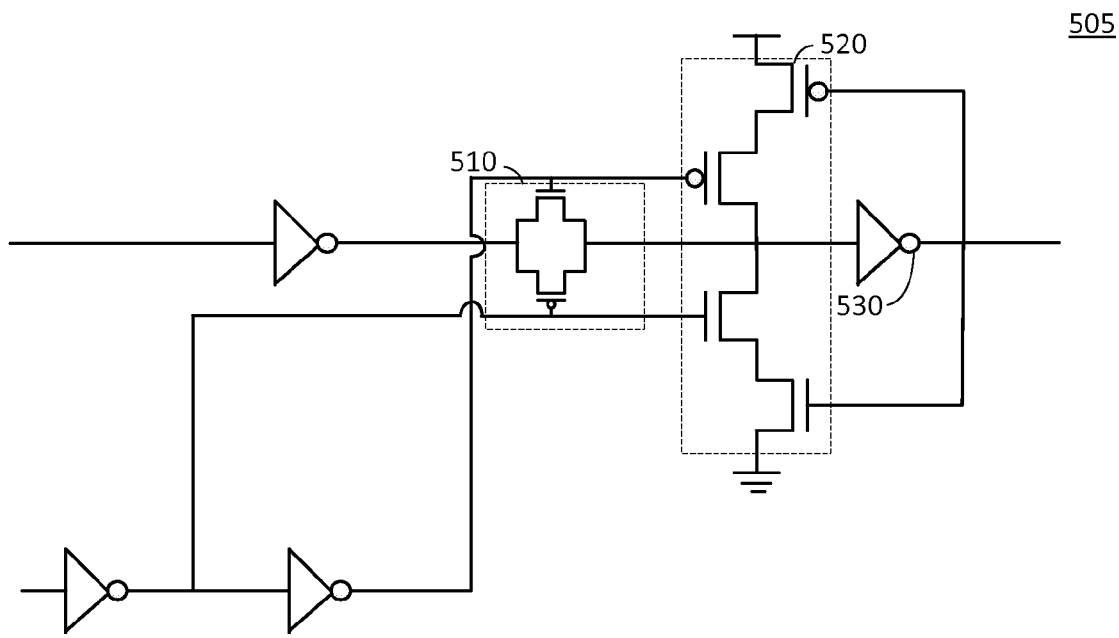
FIG. 5 shows an example of a flop with a CMOS transfer gate.
Figure 6:
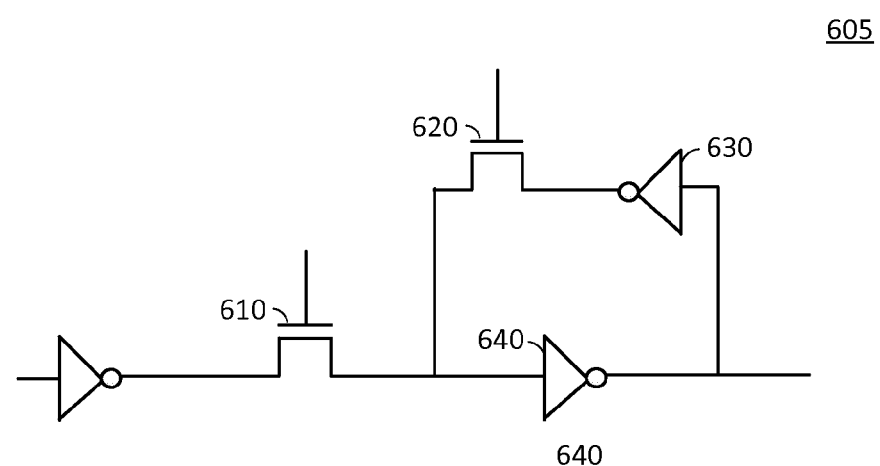
FIG. 6 shows an example of a flop with a single-NFET transfer gate.

In this regard, FIGS. 5 and 6 illustrate an example of gate count reduction using the high-voltage clock signal 110/210 according to embodiments of the present disclosure. FIG. 5 shows an example of a flip-flop 505 comprising a CMOS transfer gate 510, a tri-state inverter 520, and an inverter 530. The tri-state inverter 520 and the inverter 530 form a switchable latch, and the CMOS transfer gate 510 is used to transfer logic data values to the latch.

FIG. 6 shows an example of a flop-flip 605, in which the CMOS transfer gate 510 is replaced by a first single-NFET transfer gate 610, and the tri-state inverter 520 is replaced by a second single-NFET transfer gate 620 and an inverter 630. This reduces the gate count of the flip-flop 605 by at least two compared to the flip-flop 505 in FIG. 5. The back-to-back inverters 630 and 640 form a latch that is switched by the second single-NFET transfer gate 620. In this example, the data signal may have a voltage swing between $V_L$ and ground to reduce power consumption, as discussed above. One or more of the inverters in the flip-flop 605 may be powered by $V_L$ to operate the corresponding transistors in the sub-threshold region to conserve power. The single-NFET transfer gates 610 and 620 are clocked by the high-voltage clock signal or its inverse. As discussed above, the high-voltage clock signal enables the use of single-NFET transfer gates to reduce gate count.

The gate count in a scan multiplexer can also be reduced. A conventional scan multiplexer includes PFETs and NFETs for switching the multiplexer between a scan path for testing the functionality of one or more flops and a data path for normal operation. Since the data operates at $V_L$, the gate count of the multiplexer can be reduced by replacing a PFET and NFET pair in the multiplexer with a single NFET and coupling the gate of the single NFET to either $V_H$ or ground, depending on whether the single NFET is switched on or off. In normal operation, the single NFET is either always switched on or off since the multiplexer is always switched to the data path in normal operation. Thus, the single NFET does not consume dynamic power associated with toggling the NFET, and the gate of the NFET may be hardwired to either $V_H$ or ground.

Figure 7:
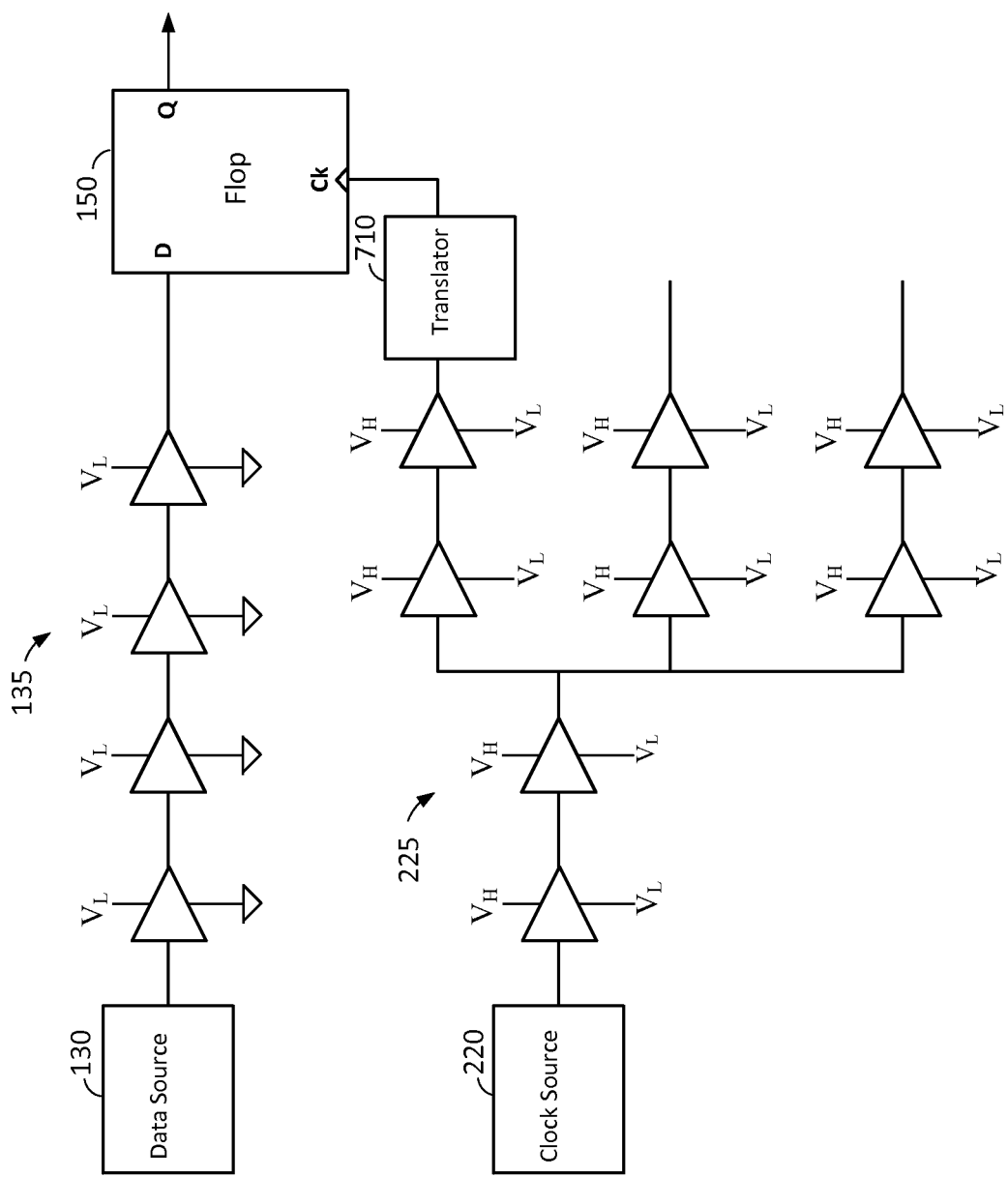
FIG. 7 shows an example of a clock tree with a voltage translator at an end of the clock tree according to an embodiment of the present disclosure.
Figure 8A:
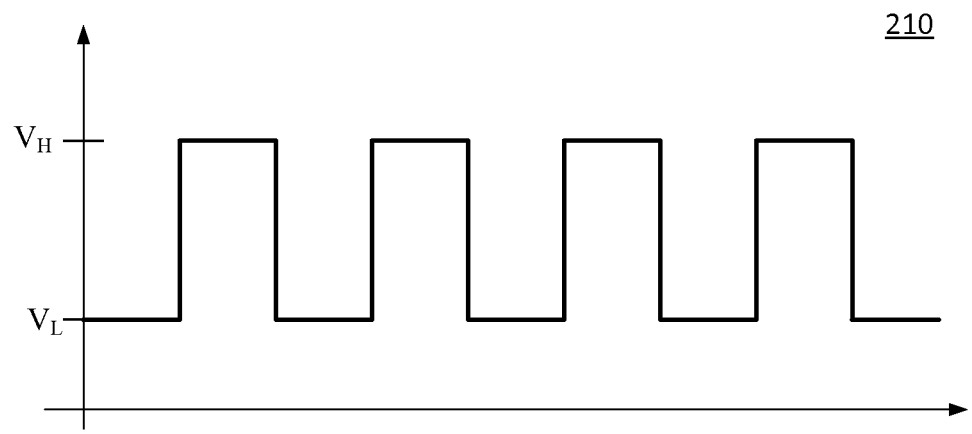
FIG. 8A shows an example of a clock signal input to the translator according to an embodiment of the present disclosure.
Figure 8B:
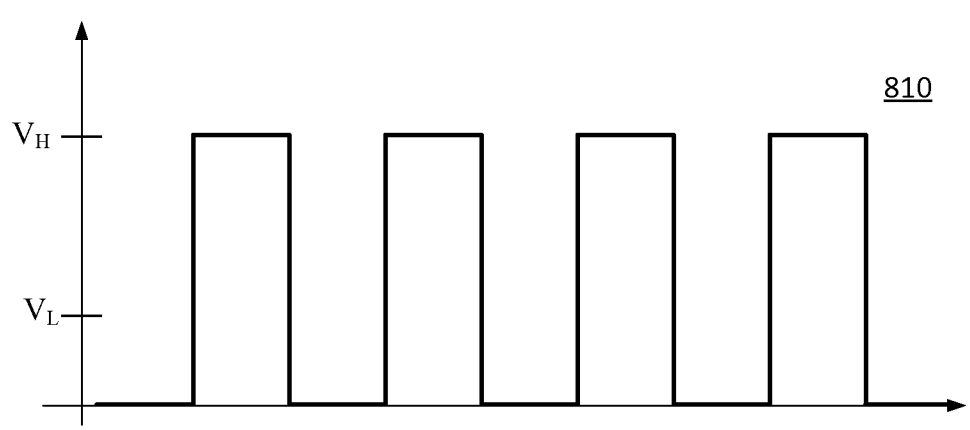
FIG. 8B shows an example of a translated clock signal output from the translation according to an embodiment of the present disclosure.

As discussed above (e.g., in relation to FIGS. 2A and 2B), the voltage of the high-voltage clock signal 210 may swing between $V_H$ and $V_L$. Thus, the high-voltage clock signal 210 has a low state corresponding to a voltage of $V_L$. In some applications, $V_L$ may not be low enough to completely turn off a transfer gate, resulting in leakage current that may be too high. Accordingly, in one embodiment, a voltage translator may be placed at an end of the clock tree before the high-voltage clock signal 210 is input to the corresponding device (e.g., flop). FIG. 7 shows an example of a voltage translator 710 at the end of the clock tree 225 corresponding to flop 150. The translator 710 translates the high-voltage clock signal 210 to a translated high-voltage clock signal having a lower low-state voltage. FIG. 8A shows an example of the high-voltage clock signal 210, which has a voltage swing between $V_H$ and $V_L$. FIG. 8B shows the translated high-voltage clock signal 810 output from the voltage translator 810. The translated high-voltage clock signal 810 may be slightly delayed compared with the high-voltage clock signal 210 due to internal delays in the translator 710. In this example, the translated high-voltage clock signal 810 has a voltage swing between $V_H$ and ground (full voltage-swing). The translated high-voltage clock signal 810 is input to the flop 150 so that the logic in the flop is clocked using the translated clock signal. For example, the translated clock signal 810 may be used to clock the transfer gates, in which the lower low-state voltage of the translated clock signal 810 reduces leakage current of transfer gates in the off state.

Figure 9:
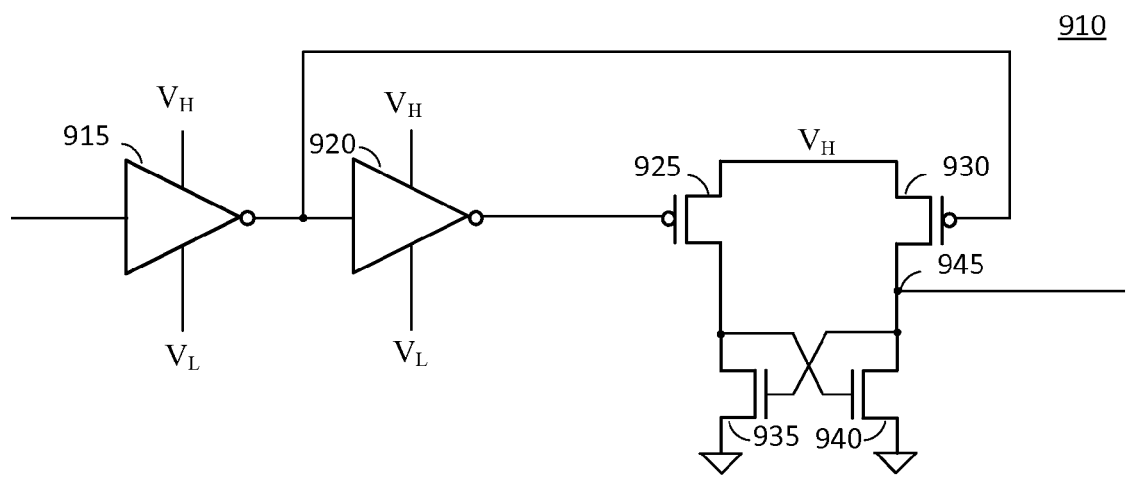
FIG. 9 shows an exemplary implementation of the translator according to an embodiment of the present disclosure.

FIG. 9 shows an exemplary implementation of a voltage translator 910 according to an embodiment of the present disclosure. The voltage translator 910 may be used to implement the translator 710 shown in FIG. 7 to provide a translated clock signal with a full-voltage swing. The translator 910 comprises a first invertor 915, a second inverter 920, a first PFET 925, a second PFET 930, and a first NFET 935, and a second NFET 940. The first and second inverters 915 and 920 are coupled in series and are powered between $V_H$ and $V_L$. The sources of the first PFET 925 and second PFET 930 are coupled to $V_H$, the drain of the first NFET 935 is coupled to the drain of the first PFET 925, the drain of the second NFET 940 is coupled to the drain of the second PFET 930, and the sources of the first NFET 935 and the second NFET 940 are coupled to ground. The gate of the first PFET 925 is driven by the output of the second inverter 920 and the gate of the second PFET 930 is driven by the output of the first inverter 915. The gate of the first NFET 935 is cross coupled to the drains of the second PFET 930 and the second NFET 940. The gate of the second NFET 940 is cross coupled to the drains of the first PFET 925 and the first NFET 935. The output of the translator 950 is taken from node 945.

The high-voltage clock signal 210 may be input to the first inverter 915. When the input clock signal is in a high state, the gate of the first PFET 925 is driven high with a voltage of $V_H$ and the gate of the second PFET 930 is driven low with a voltage of $V_L$. This causes the first PFET 925 to turn off and the second PFET 930 to turn on (assuming $V_H$–$V_L$ is sufficient to turn on the second PFET 930). This causes the second PFET 930 to pull up the voltage at node 945 to approximately $V_H$.

When the input clock signal is in a low state, the gate of the first PFET 925 is driven low with a voltage of $V_L$ and the gate of the second PFET 930 is driven high with a voltage of $V_H$. This causes the first PFET 925 to turn on and the second PFET 930 to turn off. As a result, the first PFET 925 pulls up the voltage at the drain of the first PFET 925 to approximately $V_H$. This voltage is coupled to the gate of the second NFET 940, which turns on the second NFET 940. This causes the second NFET 940 to pull down the voltage at node 945 to approximately ground.

Thus, the translated clock signal at the output of the translator 910 has approximately a full-voltage swing (between $V_H$ and ground). An additional inverter may be added to the output of the translator 910 to invert the translated clock signal. The additional inverter may be powered between $V_H$ and ground. It is to be appreciated that the circuit shown in FIG. 9 is exemplary only, and that the translator may be implemented using other circuit designs.

Figure 10:
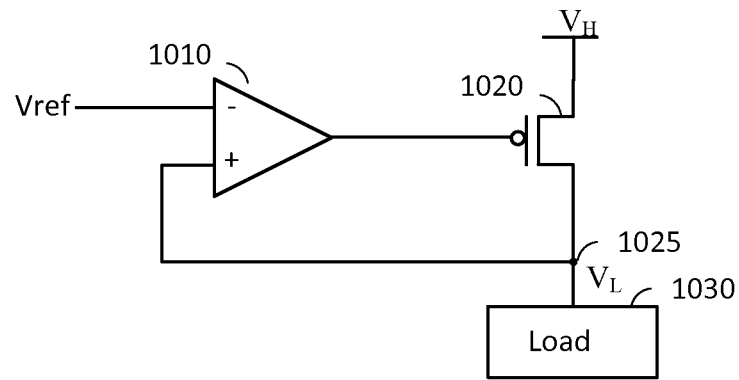
FIG. 10 shows an example of a low dropout (LDO) regulator.

The low voltage $V_L$ may be provided by a low-dropout (LDO) regulator. FIG. 10 shows an example of an LDO comprising an amplifier 1010 and a FET 1020 (e.g., PFET). A reference voltage Vref and the voltage at node 1025 are input to the amplifier 1010. Using negative feedback, the amplifier 1010 drives the gate of the FET 1020 in a direction that minimizes the difference between Vref and the voltage at node 1025, and thus regulates the voltage at node 1025 to be approximately Vref. Vref may be set to provide a desired low voltage $V_L$ (e.g., using a bandgap reference) for operating logic in the sub-threshold region. While the LDO may be suitable for providing a stable $V_L$, the LDO may be inefficient. This is because current to the load 1030 of the logic has to pass though the FET 1020. This creates an IR drop across the FET 1020 that dissipates power, and therefore wastes energy.

Figure 11:
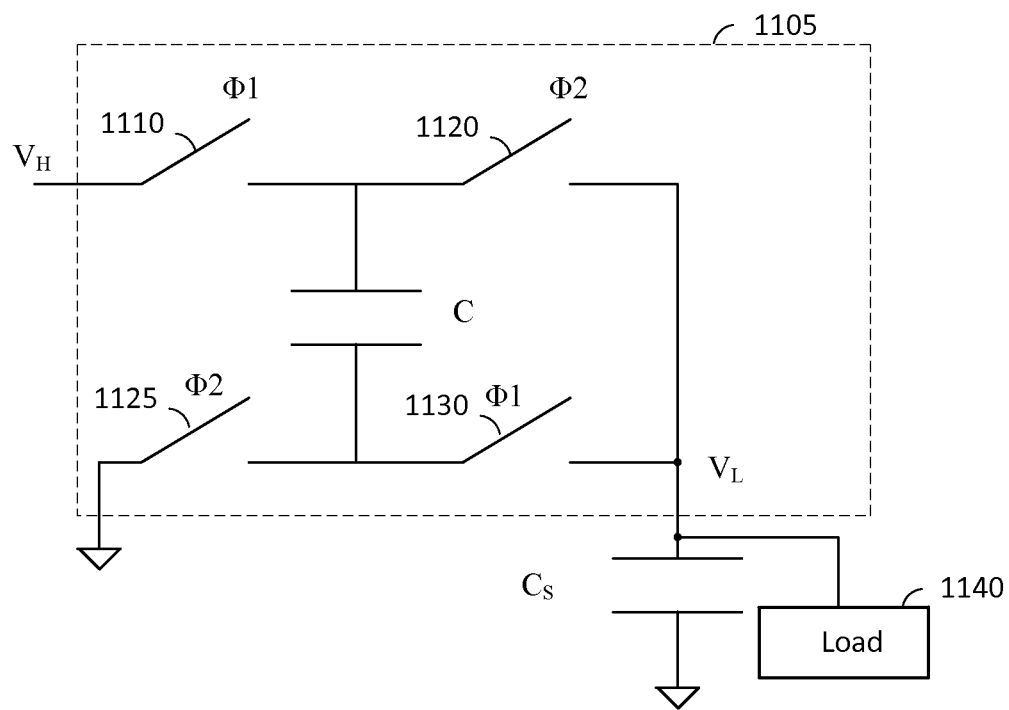
FIG. 11 shows a switched-capacitor DC-to-DC converter according to an embodiment of the present disclosure.

Accordingly, in some embodiments, the low voltage $V_L$ is provided by switched-capacitor DC-to-DC converter. FIG. 11 shows a DC-to-DC converter 1105 according to an embodiment of the present disclosure. The converter 1105 comprises a first switch 1110, a second switch 1120, a third switch 1125, a fourth switch 1130, and a capacitor C. The capacitor C may include capacitance from the clock tree. For example, the capacitor C may include one or more capacitors in the clock tree. This allows charge used for propagating the clock signal in the clock tree to be dumped to the low-power supply for operating logic at $V_L$, thereby providing improved power efficient.

In FIG. 11, phase Φ1 may correspond to the high state of the clock signal and phase Φ2 may correspond to the low state of the clock signal. In phase Φ1, the first and fourth switches 1110 and 1130 are closed and the second and third switches 1120 and 1125 are open. As a result, the capacitor C is coupled to $V_H$, and the top terminal of the capacitor C is charged to $V_H$. The voltage across the capacitor C is charged to approximately $V_H$–$V_L$.

In phase Φ2, the first and fourth switches 1110 and 1130 are opened and the second and third switches 1120 and 1125 are closed. As a result, the capacitor C is coupled between the low-power supply and ground. Assuming that $V_H$–$V_L$>$V_L$, this causes charge from the capacitor C to be dumped into a storage capacitor $C_S$ of the low-power supply. The charge provides energy for the load 1140 of logic operating at $V_L$. The load 1140 may include the load of logic (e.g., buffers) in a data path and/or the load of logic (e.g., inverters) in a flop that are operated at $V_L$.

Thus, the voltage at the top terminal of the capacitor C in the DC-to-DC converter 1105 switches between approximately $V_H$ and $V_L$. This allows the capacitor C to include capacitors from the clock tree since the capacitors in the clock tree also switch between $V_H$ and $V_L$ to propagate the high-voltage clock signal 210. Thus, charge used to propagate the clock in the clock tree can be reused to power the low-voltage supply. The capacitors in the clock tree may include the capacitance of the output node of each inverter of the clock tree, where each inverter is used as a buffer. Each inverter may charge and discharge the respective output node between $V_H$ and $V_L$ to propagate the clock signal. When the output node is discharged to $V_L$, the charge can be dumped to the low-power supply.

In some embodiments, the capacitance from the clock tree may effectively be in parallel with capacitor C. For true signals of the clock, PFET drivers in the clock tree may act like switch 1110 on phase Φ1, and on phase Φ2, NFET drivers in the clock tree may act like switch 1120. For false signals of the clock, the switches may effectively act on the opposite phases. The capacitance of the clock tree may share the same top connection as capacitor C, but the bottom plate of the clock tree capacitance may be distributed between $V_L$, ground and other signals.

Figure 13:
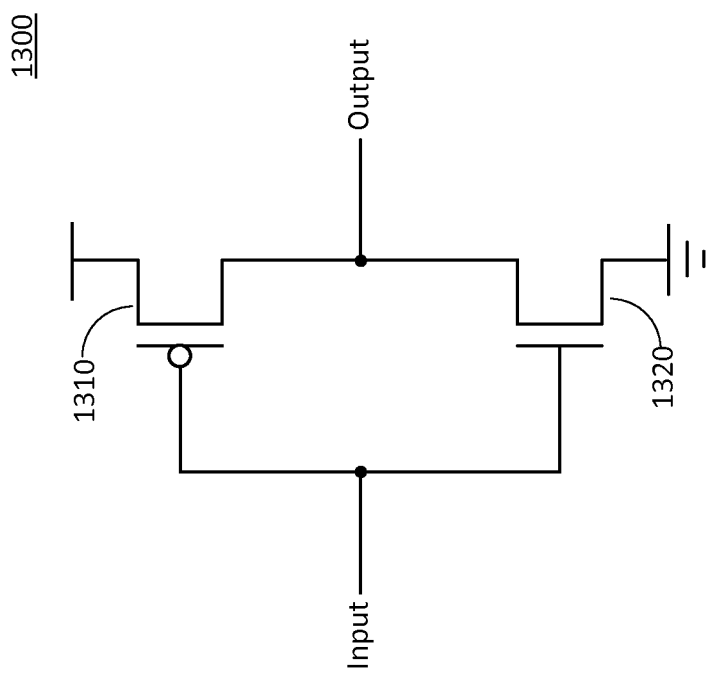
FIG. 13 shows an exemplary implementation of an inverter.

In the above example, each inverter in the clock tree may be implemented using a PFET and an NFET (an example of which is shown in FIG. 13), in which each inverter turns on the respective PFET to charge the respective clock tree capacitance and turns on the respective NFET to discharge the respective clock tree capacitance. Some or all of the PFET drivers discussed in the above example may correspond to PFETs of the inverters, and some or all of the NFET drivers discussed in the above example may correspond to NFETs of the inverters. Thus, the PFET of an inverter may act as a switch that charges the respective capacitance (e.g., to $V_H$) and the NEFT of an inverter may act as switch that discharges the respective capacitance (e.g., to $V_L$).

The capacitance of the capacitor C may be adjusted so that the amount of charge discharged to the storage capacitor $C_S$ of the low-power supply per clock cycle approximately replenishes the amount of charge consumed by the load 1140 per clock cycle. To do this, the capacitor C may include a variable capacitor (not shown) coupled in parallel with the capacitors from the clock tree. The capacitance of the variable capacitor may be adjusted so that the amount of charge discharged to the storage capacitor $C_S$ of the low-power supply per clock cycle approximately replenishes the amount of charge consumed by the load 1140 per clock cycle to maintain a desired low voltage. If the capacitance of the clock tree is not capable of providing enough charge for the low-power supply, then one or more additional capacitors may be added to capacitor C. It is to be appreciated that the DC-to-DC converter shown in FIG. 11 is exemplary only, and the DC-to-DC converter may be implemented using other configurations.

Operating the data path/logic at the sub-threshold voltage saves a large amount of power as compared with operating above the threshold voltage. However, clocking is unreliable as discussed above. Embodiments of the present disclosure use a high-voltage clock along with sub-threshold data path/logic which solves the timing issues discussed above. However, running the clock at the high voltage consumes more power. Some of the additional power consumed by the high voltage clock is recovered as illustrated in FIG. 11 and discussed above and used to provide the sub-threshold voltage to the data path/logic. The result is a very power efficient solution without the timing issues discussed above.

Power consumption can be reduced by reducing the low-power supply voltage $V_L$. However, if $V_L$ is reduced too much, then the system stops functioning properly. For example, in order for a flop to properly latch a logic value of a data signal, the data signal needs to be stable for a period of time before a clock edge used by the flop to clock in the data signal (referred to as setup time). However, as $V_L$ is reduced, the propagation delay in the corresponding data path increases. This is because the speed of the logic (e.g., buffers) in the data path slows down when $V_L$ is reduced. Eventually, the propagation delay increases to a point where the data signal does not settle to a stable value at the flop in time to meet the setup-time condition. As a result, a setup violation occurs, and the flop may enter a metastable state. Thus, power consumption can be minimized by reducing the low-power supply voltage $V_L$ to the minimum voltage needed by the system to function properly (lowest working voltage).

Figure 12:
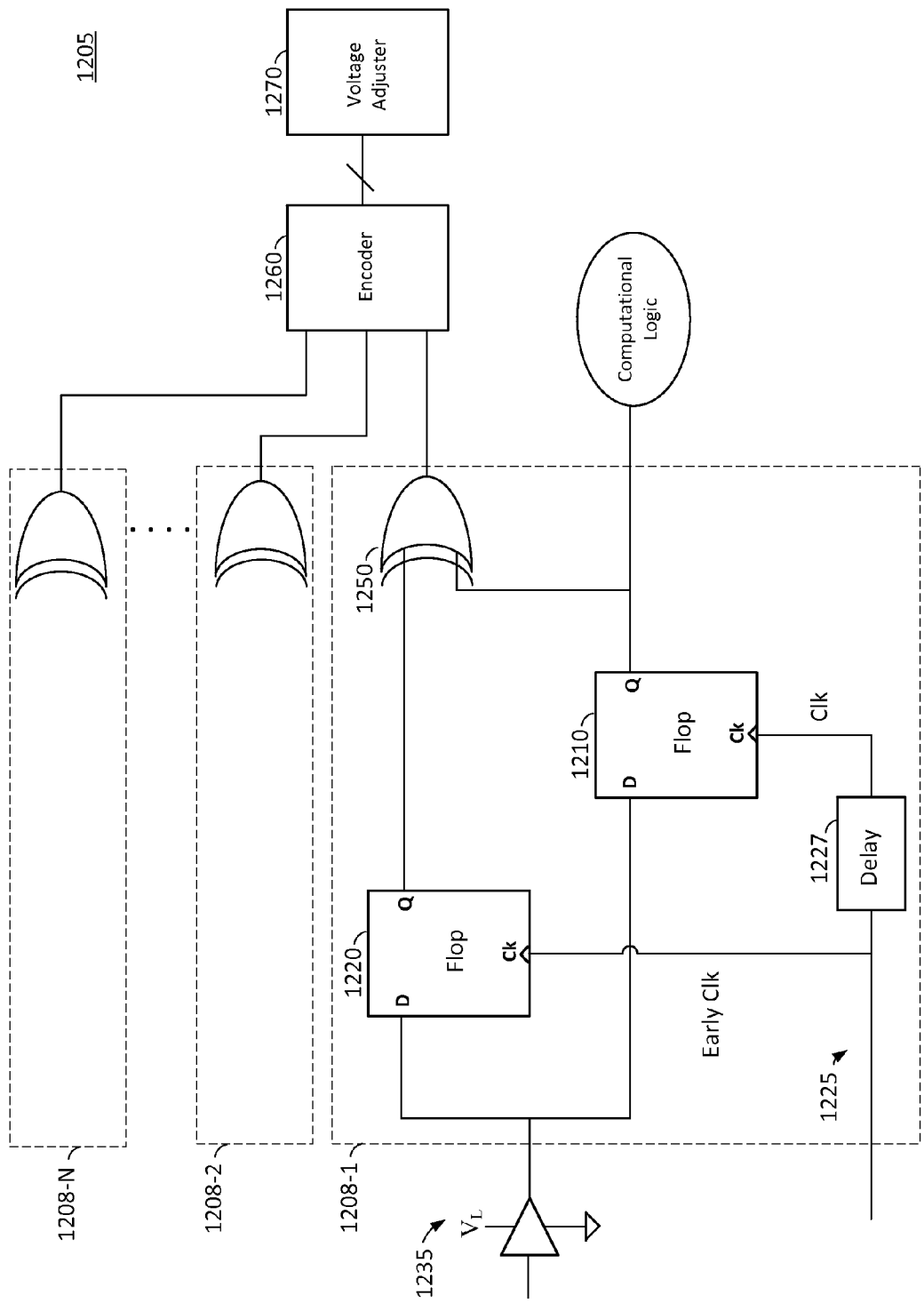
FIG. 12 shows a tuning circuit for adjusting a low-power supply voltage according to an embodiment of the present disclosure.

FIG. 12 shows a tuning circuit 1205, according to one embodiment, for tuning the low-power supply voltage $V_L$ to a voltage close to or at the minimum voltage needed by a system to prevent setup violations at a given clock frequency. The tuning circuit 1205 comprises a first test unit 1208-1. The test unit 1208-1 comprises a normal flop 1210, a test flop 1220, and an XOR gate 1250. The normal flop 1210 is a flop that is used to latch a data signal in the system and output the latched data to computational logic in the system. The test flop 1220 (shadow flop) may be used to approximate the minimum $V_L$ needed by the normal flop 1210 to avoid setup violations, as discussed further below. The test flop 1220 and the normal flop 1210 may be implemented using the same circuit so that the test flop 1220 mimics the normal flop 1210.

The test flop 1220 and the normal flop 1210 are coupled to the end of the same data path 1235. As a result, the timing of the data signal at the test flop 1220 and the normal flop 1210 are approximately the same. The clock inputs of the test flop 1220 and the normal flop 1210 are coupled to different points along a clock path 1225, in which the clock signal on the clock path 1225 has to propagate through a delay element 1227 before reaching the normal flop 1210 compared with the test flop 1220. As a result, the test flop 1220 receives an earlier version of the clock signal received by the normal flop 1210. The earlier version of the clock signal is ahead by an amount approximately equal to the time delay of the delay element 1227.

The output of the normal flop 1210 is coupled to a first input of the XOR gate 1250 and the output of the test flop 1220 is coupled to a second input to the XOR gate 1250. The output of the normal flop 1210 is also coupled to computational logic. The XOR gate 1250 outputs a logic zero when the outputs of the normal flop 1210 and test flop 1220 match. This may indicate that both flops 1210 and 1220 are working properly. The XOR gate 1250 outputs a logic zero when the outputs of the normal flop 1210 and test flop 1220 do not match. This may indicate that a setup violation has occurred at the test flop 1220, as discussed further below.

To determine the minimum $V_L$ at which the normal flop 1210 works properly, the output of the XOR gate 1250 may be monitored as $V_L$ is reduced. Initially, the output of the XOR gate 1250 may be logic zero, indicating that both flops 1210 and 1220 are working properly. As $V_L$ is reduced, the propagation delay of the data path 1235 increases. At a certain point, setup violations will start occurring at the test flop 1220, but not at the normal flop 1210. This is because the test flop 1220 clocks the data signal using an earlier version of the clock signal used by the normal flop 1210.

Thus, while the test flop 1220 may start experiencing setup violations, the normal flop 1210 may still be working properly. However, this may indicate that the normal flop 1210 will also start experiencing setup violations if $V_L$ is reduced any further. Thus, the voltage at which the test flop 1220 starts experiencing setup violations may be used as an approximation of the minimum low-power supply voltage $V_L$ needed by the normal flop 1210 to prevent setup violations.

When the test flop 1220 starts experiencing setup violations, the output of the test flop 1220 and the normal flop 1210 cease to match, and the XOR gate 1250 outputs a logic one. Thus, the voltage at which the XOR gate 1250 outputs a logic one may be used as an approximation of the minimum low-power supply voltage $V_L$ needed by the normal flop 1210 to prevent setup violations.

As shown in FIG. 12, the tuning circuit 1205 may include a plurality of test units 1208-1 to 1208-N, in which each test unit comprises a test flop paired with a normal flop in the system and an XOR gate coupled to the outputs of the respective test flop and normal flop. Each of the test units 1208-1 to 1208-N may be implemented using the circuit shown in FIG. 12 for test unit 1208-1. For ease of illustration, only the XOR gates of test units 1208-2 and 1208-N are shown in FIG. 12. In operation, each test unit 1208-1 to 1208-N may output a zero when the outputs of the respective test flop and normal flop match, and output a one when the outputs of the respective test flop and normal flop do not match.

The test units 1208-1 and 1208-N may be spread out on a chip to test different areas of the chip, which may experience different propagation delays due to process-voltage-temperature (PVT) variations on the chip. The test units 1208-1 and 1208-N may have different data paths and/or different numbers of clock buffers.

The tuning circuit 1205 may further comprise an encoder 1260 and a voltage adjuster 1270. The outputs of the test units 1208-1 to 1208-N are coupled to the encoder 1260. The encoder 1260 may be configured to count the number of test units 1208-1 to 1208-N outputting a logic one, and output the count value to the voltage adjuster 1270. The voltage adjuster 1270 may use the count value to determine a minimum low-power supply voltage $V_L$. For example, the voltage adjustor 1270 may gradually reduce $V_L$ while monitoring the count value. The voltage adjuster 1270 may stop reducing $V_L$ when the count value reaches a threshold. The voltage adjuster 1270 may then continue to monitor the count value. If the count value rises above the threshold (e.g., for a certain time period), then the voltage adjuster 1270 may increase $V_L$ until the count value falls back to the threshold. In this context, the threshold corresponds to a certain error rate (e.g., due to setup violations), and should not be confused with the threshold voltage of a transistor.

The voltage adjuster 1270 may adjust the low-power supply voltage $V_L$ using various techniques. For example, when $V_L$ is provided by a LDO regulator, the voltage adjuster 1270 may adjust $V_L$ by adjusting the reference voltage Vref input to the LDO. When $V_L$ is provided by a DC-to-DC converter (e.g., DC-to-DC converter 1105), the voltage adjuster 1270 may adjust $V_L$ by adjusting the capacitance of the DC-to-DC converter capacitor (e.g., capacitor C). For example, the voltage adjustor 1270 may reduce $V_L$ by reducing the capacitance and increase $V_L$ by increasing the capacitance. In this example, the DC-to-DC converter capacitor may include a variable capacitor for adjusting the capacitance. The DC-to-DC converter capacitor may also comprise one or more fixed capacitors (e.g., coupled in parallel with the variable capacitor).

In one embodiment, the variable capacitor may comprise a plurality of individual capacitors and a plurality of switches for independently switching the individual capacitors into and out of a capacitor bank that sets the capacitance of the variable capacitor. In this embodiment, the voltage adjustor 1270 may adjust the capacitance of the variable capacitor by switching one or more of the individual capacitors into the capacitor bank using the switches to achieve the desired capacitance. Individual capacitors that are switched into the capacitor bank by the respective switches contribute to the capacitance of the variable capacitor, while individual capacitors that are switched out of the capacitor bank by the respective switches do not.

A method for tuning the low-power supply voltage $V_L$ will now be described according to an embodiment of the present disclosure. First, the clock frequency may be set to meet a desired workload. The workload may depend on the particular application of the corresponding system. For example, for a system in a medical device, the workload may depend on the frequency at which the medical device (e.g., pacemaker) monitors a patient's heart rate. For a system configured to awaken a computing device when a user input is detected on a user interface (e.g., a keypad or a touch screen), the workload may depend on the frequency at which the system checks the user interface for a user input.

After the clock frequency is set, the low-power supply voltage $V_L$ may be adjusted to the lowest working voltage for that clock frequency. This may be done, for example, using the tuning circuit 1205. In this example, the voltage adjuster 1270 may gradually reduce the low-power supply voltage $V_L$ while monitoring the count value from the encoder 1260, and stop reducing the low-power supply voltage $V_L$ when the count value reaches a threshold.

In one embodiment, a memory (e.g., SRAM and/or DRAM) may be powered between the voltage differential (between $V_H$ and $V_L$) of the high-voltage clock signal 210. The voltage differential may be above the threshold voltages of the transistors in the memory, enabling the memory to operate at higher speeds. In this embodiment, one or more of the NFETs in the memory may be back-biased to reduce leakage current. For example, an NFET may be back-biased by tying the body of the NFET to ground. This creates a source-to-body bias of $V_L$, which reduces the leakage current of the NFET.

Although the low voltage $V_L$ is described as being below the threshold voltage in the examples discussed above, it is to be appreciated that the low voltage $V_L$ may also be approximately at the threshold voltage, in which case transistors operate near the sub-threshold region. This may still provide power savings, although not as much as can be achieved by operating the transistors in the sub-threshold region. As used herein, the threshold voltage of a transistor may refer to the gate voltage at which the transistor enters the strong-inversion region.

FIG. 13 shows an exemplary complimentary-pair inverter 1300 that can be used as a buffer in the clock path and/or data path. The complimentary-pair inverter 1300 comprises a PFET 1310 and an NFET 1320. The source of the PFET 1310 is coupled to a power supply (e.g., $V_H$ or $V_L$), the source of the NFET 1320 is coupled to ground or $V_L$, the drains of the PFET and NFET 1310 and 1320 are coupled to the output of the inverter 1300, and the gates of the PFET and NFET 1310 and 1320 are coupled to the input of the inverter 1300.

When the inverter 1300 is used for a clock tree inverter, the source of the PFET 1310 may be coupled to $V_H$ and the source of the NFET 1320 may be coupled to the low-power supply. When the inverter 1300 is driven high, the PFET 1310 turns on and charges the respective capacitance to $V_H$ and, when the inverter is driven low, the NFET 1320 turns on and discharges the respective capacitance to the low-power supply, thereby dumping charge to the low-power supply. In this example, the PFET 1310 may act as switch 1110 and the NFET 1320 may act as switch 1120.

Figure 14:
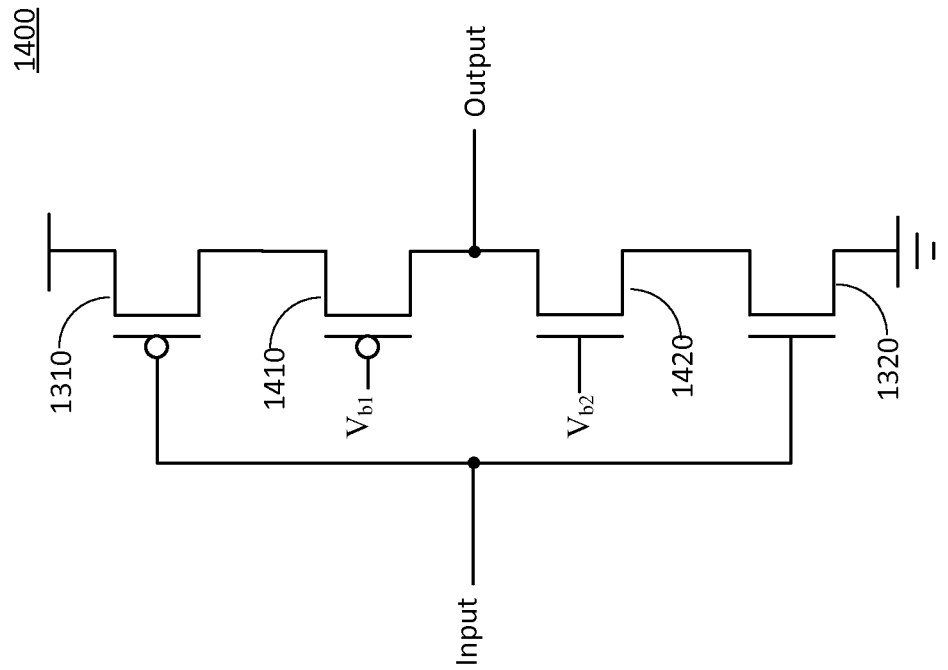
FIG. 14 shows another exemplary implementation of an inverter.

FIG. 14 shows another exemplary inverter 1400 that can be used as a buffer. The inverter 1400 is similar to the complimentary-pair inverter 1300 in FIG. 13, and further includes a common-gate PFET 1410 coupled between the drain of the PFET 1310 and the output of the inverter, and a common-gate NFET 1420 coupled between the output of the inverter and the drain of the NFET 1320. The gate of the common-gate PFET 1410 is biased by DC voltage $V_{b1}$ and the gate of the common-gate NFET 1420 is biased by DC voltage $V_{b2}$.

Figure 15:
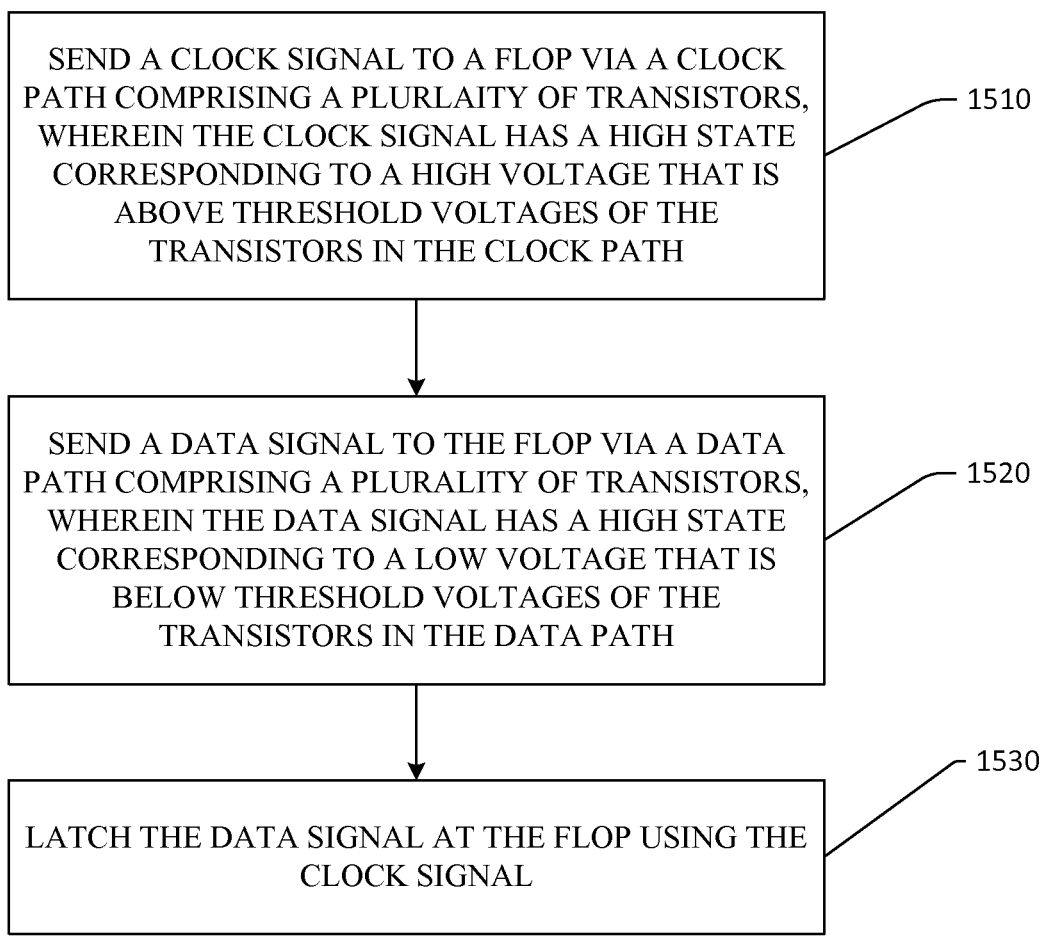
FIG. 15 is a flowchart illustrating a method 1500 for low power operation according to an embodiment of the present disclosure.

FIG. 15 is a flowchart illustrating a method 1500 for low power operation according to an embodiment of the present disclosure.

At step 1510, a clock signal is sent to a flop via a clock path comprising a plurality of transistors, wherein the clock signal has a high state corresponding to a high voltage that is above threshold voltages of the transistors in the clock path. For example, the clock signal (e.g., clock signal 110/210) may be generated by a clock source (e.g., clock source 120/220). The clock path (e.g., clock path 125/225) may include buffers (e.g., inverters) comprising transistors (e.g., transistors 1310 and 1320), in which the high state of the clock signal corresponds to a high voltage (e.g., $V_H$) that is above threshold voltages of the transistors in the clock path.

At step 1520, a data signal is sent to the flop via a data path comprising a plurality of transistors, wherein the data signal has a high state corresponding to a low voltage that is below threshold voltages of the transistors in the data path. For example, the data signal (e.g., data signal 212) may be generated by a data source (e.g., data source 130). The data path (e.g., data path 135) may include buffers (e.g., inverters) comprising transistors (e.g., transistors 1310 and 1320), in which the high state of the data signal corresponds to a low voltage (e.g., $V_L$) that is below threshold voltages of the transistors in the data path. This allows the transistors in the data path to operate in the sub-threshold region to reduce power consumption. It is to be appreciated that the plurality of transistors in step 1520 is not necessarily all of the transistors in the data path.

At step 1530, the data signal is latched at the flop using the clock signal. For example, the flop (e.g., flop 150) may latch data values from the data signal on rising and/or falling edges of the clock signal.

Figure 16:
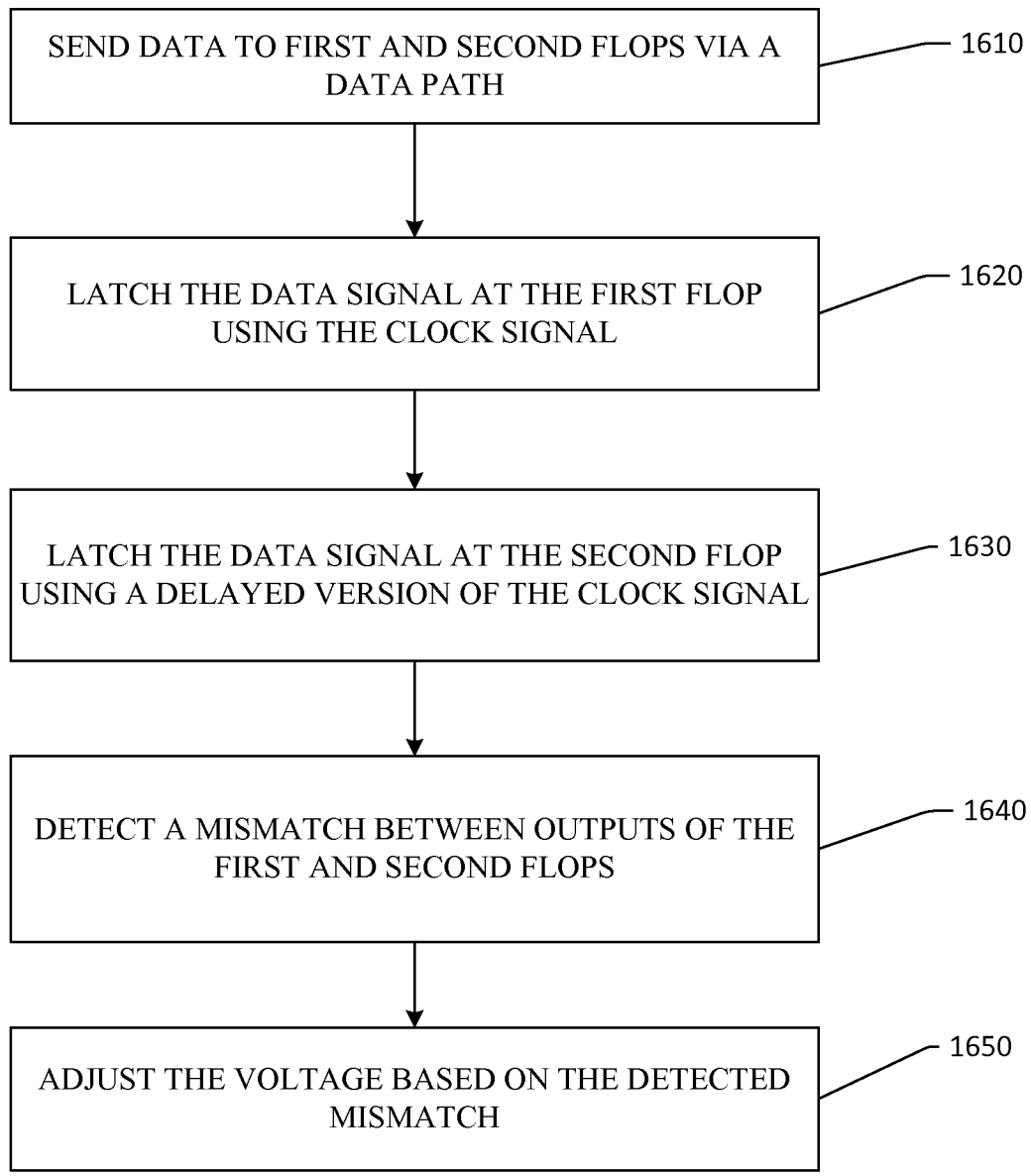
FIG. 16 is a flowchart illustrating a method 1600 for tuning a voltage according to an embodiment of the present disclosure.

FIG. 16 is a flowchart illustrating a method 1600 for tuning a voltage according to an embodiment of the present disclosure.

At step 1610, a data signal to sent to first and second flops via a data path. For example, the data signal (e.g., data signal 212) may be sent via a data path (e.g., data path 1235) comprising buffers (e.g., inverters) powered by the voltage that is being tuned.

At step 1620, the data signal is latched at the first flop using a clock signal. At step 1630, the data signal is latched at the second flop using a delayed version of the clock signal. For example, the clock signal at the second flop (e.g., flop 1210) may be delayed with respect to the clock signal at the first flop (e.g., flop 1220) by a delay element (e.g., delay element 1227). Equivalently, the clock signal at the first flop (e.g., 1220) may be said to be an early version of the clock signal at the second flop (e.g., 1210).

At step 1640, a mismatch between outputs of the first and second flops is detected. For example, a mismatch between the outputs of the first and second flops (e.g., flops 1210 and 1220) may be detected by coupling the outputs of the first and second flops to an XOR gate (e.g., XOR gate 1250). The XOR gate outputs a logic zero when the outputs match and a logic one when the outputs do not match. Thus, in this example, a mismatch is detected when a logic one is output from the XOR gate.

At step 1650 the voltage is adjusted based on the detected mismatch. In one embodiment, a chip may comprise a plurality of flop pairs including the first and second flops, in which steps 1610-1640 may be performed at each of the flop pairs. In this embodiment, a number of detected mismatches among the flop pairs may be counted to produce a count value, and the voltage may be adjusted based on the count value. For example, the voltage may be reduced if the count value is below a threshold.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A device for tuning a voltage, comprising:
   a data path for propagating a data signal, wherein data path comprises a plurality of transistors, and the voltage is used to power the transistors in the data path;
   a first flop configured to receive the data signal from the data path, to receive a clock signal, and to latch the data signal using the clock signal;
   a second flop configured to receive the data signal from the data path, to receive a delayed version of the clock signal, and to latch the data signal using the delayed version of the clock signal;
   a circuit configured to detect a mismatch between outputs of the first and second flops; and
   a voltage adjuster configured to adjust the voltage based on the detected mismatch.

2. The device of claim 1, wherein the voltage is below threshold voltages of the transistors in the data path.

3. The device of claim 1, wherein the circuit is configured to receive detected mismatches for a plurality of flop pairs including the first and second flops, and to count a number of the received mismatches to produce a count value, and the voltage adjuster is configured to adjust the voltage based on the count value.

4. The device of claim 3, wherein the voltage adjuster is configured to reduce the voltage if the count value is below a threshold.

5. A method for tuning a voltage, comprising:
   sending a data signal to first and second flops via a data path, wherein the data path comprises a plurality of transistors;
   powering the transistors in the data path with the voltage;
   latching the data signal at the first flop using a clock signal;
   latching the data signal at the second flop using a delayed version of the clock signal;
   detecting a mismatch between outputs of the first and second flops; and
   adjusting the voltage based on the detected mismatch.

6. The method of claim 5, wherein the voltage is below threshold voltages of the transistors in the data path.

7. The method of claim 5, further comprising:
   receiving mismatches for a plurality of flop pairs including the first and second flops; and
   counting a number of the received mismatches to produce a count value, wherein adjusting the voltage comprises adjusting the voltage based on the count value.

8. The method of claim 7, wherein adjusting the voltage comprises reducing the voltage if the count value is below a threshold.

* * * * *